United States Patent
Liu et al.

(10) Patent No.: US 9,093,427 B2
(45) Date of Patent: Jul. 28, 2015

(54) METHOD FOR FABRICATING SEMICONDUCTOR DEVICE

(71) Applicant: National Chiao Tung University, Hsinchu (TW)

(72) Inventors: Po-Tsun Liu, Hsinchu (TW); Li-Feng Teng, Taoyuan County (TW); Yuan-Jou Lo, Taoyuan County (TW); Yao-Jen Lee, Kaohsiung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 13/921,611

(22) Filed: Jun. 19, 2013

(65) Prior Publication Data
US 2014/0287561 A1     Sep. 25, 2014

(30) Foreign Application Priority Data
Mar. 21, 2013   (TW) .............................. 102110004 A

(51) Int. Cl.
| | |
|---|---|
| *H01L 21/00* | (2006.01) |
| *H01L 21/477* | (2006.01) |
| *H01L 29/66* | (2006.01) |
| *H01L 29/786* | (2006.01) |

(52) U.S. Cl.
CPC ........ *H01L 21/477* (2013.01); *H01L 29/66969* (2013.01); *H01L 29/78693* (2013.01)

(58) Field of Classification Search
None
See application file for complete search history.

(56) References Cited

U.S. PATENT DOCUMENTS

2011/0014745 A1*   1/2011  Miyanaga ................. 438/104

OTHER PUBLICATIONS

Li-Feng Teng et al., "Effects of microwave annealing on electrical enhancement of amorphous oxide semiconductor thin film transistor", Sep. 24, 2012, Applied Physics Letters 101, 132901 (2012).

* cited by examiner

*Primary Examiner* — Kyoung Lee
(74) *Attorney, Agent, or Firm* — Bacon & Thomas, PLLC

(57) ABSTRACT

A method for fabricating a semiconductor device is disclosed in the present invention. The abovementioned method comprises the following steps. Firstly, a gate is formed on a substrate. A gate insulating layer is then formed on the gate, and further an active layer is disposed on the gate insulating layer, wherein the active layer is composed of a microwave absorbing material. Source/drain is defined on the active layer to form the semiconductor device, and a microwave annealing process is finally performed thereon.

1 Claim, 9 Drawing Sheets

METHOD FOR FABRICATING SEMICONDUCTOR DEVICE

BACKGROUND OF THE INVENTION

1. Field of the Invention

The present invention relates to a method for fabricating semiconductor device, and particularly to a method for fabricating semiconductor device by employing a microwave annealing process to increase the efficiency and electric reliability of semiconductor device.

2. Description of the Prior Art

Accompanying with the flourishing development of the Flat Panel Display (FPD) technology, the application of Thin Film Transistor (TFT) has been paid great attention. At present, the thin film device has been used to substitute the external integrated circuit set, in order to produce the System on Panel (SoP) for various displays and reach the goal of light, thin, low cost and high yield. Wherein, the amorphous metal oxide semiconductor has the characteristics of high carrier mobility, low process temperature, high transmittance, excellent homogeneity and transparency, which is very suitable for applying in future relevant display and products and will become one of the mainstreams for the display of next generation.

However, abovementioned technology and material have had many problems all the time, which face the bottleneck on the technological break-through. Firstly, based on the process of thin film transistor at present, there are often a lot of defects in the thin film transistor. The existence of these defects will cause low carrier mobility and low current. At the same time, they can cause high leakage current of device and reduce the reliability device.

Recently, there are many methods used to modify the defects, such as using the hydrogen or oxygen or ammonia plasma treatment, the high-temperature steam under the high-pressure treatment or the furnace tube annealing process etc. However, as for the abovementioned conventional furnace tube annealing process, the high-temperature, long-term process not only will cause the damage of device, but also will increase the burden of process.

Therefore, it is necessary to provide a method for fabricating semiconductor device, so as not only to modify the defects in semiconductor device, but also can increase the efficiency of semiconductor device.

SUMMARY OF THE INVENTION

The present invention provides a method for fabricating semiconductor device, which can be used to modify the defects in semiconductor device, and increase the efficiency of semiconductor device. The abovementioned fabricating method comprises the following steps:

Firstly, a gate is formed on a substrate. A gate insulating layer is then formed on the gate, and further an active layer is disposed on the gate insulating layer, wherein the active layer is composed of a microwave absorbing material. Source/drain is defined on the active layer to form the semiconductor device, and a microwave annealing process is finally performed thereon.

In an embodiment of the present invention, wherein the microwave absorbing material comprises: the metal oxide, the metal nitride, and the metal oxide nitride.

In an embodiment of the present invention, wherein the abovementioned active layer is: the amorphous material layer.

In an embodiment of the present invention, wherein the microwave frequency generated in the abovementioned microwave annealing process is between 2 GHz and 18 GHz.

In an embodiment of the present invention, wherein the microwave power generated in the abovementioned the microwave annealing process is less than 1500 W.

In an embodiment of the present invention, wherein the treatment time for the abovementioned microwave annealing process is between 0 second and 600 seconds.

In an embodiment of the present invention, wherein the temperature of the semiconductor device in the abovementioned microwave annealing process is less than 600° C.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
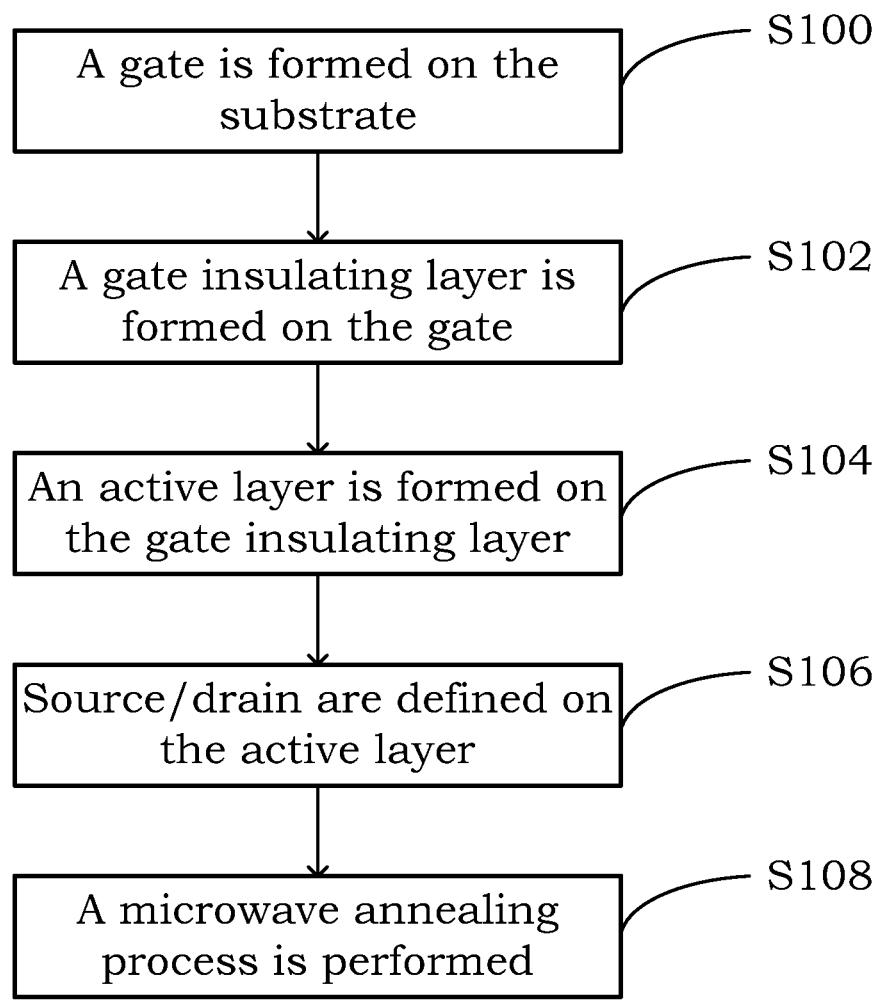
FIG. 1 illustrates the flow chart of the method for fabricating semiconductor device according to an embodiment of the present invention.
Figure 2:
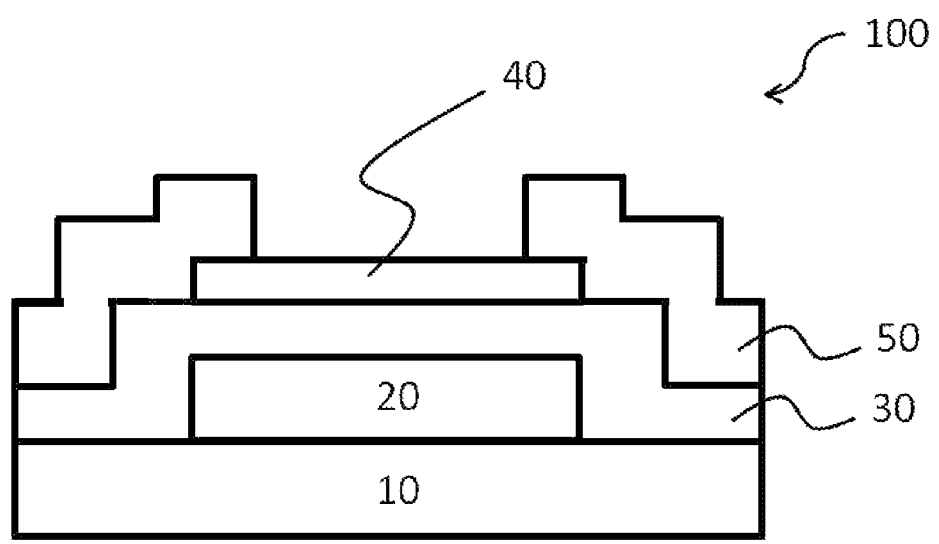
FIG. 2 illustrates the side view of the semiconductor device according to an embodiment of the present invention.

As the abovementioned description, please refer to FIG. 1 and FIG. 2. FIG. 1 illustrates the flow chart of the method for fabricating semiconductor device according to an embodiment of the present invention. FIG. 2 illustrates the side view of the semiconductor device according to an embodiment of the present invention. As shown in the Figure, the present invention provides a method for fabricating semiconductor device, which comprises the following steps. Firstly, as shown in Step S100, a gate 20 is formed on a substrate 10. As shown in Step S 102, a gate insulating layer 30 is then formed on the gate 20, and as shown in Step S104, an active layer 40 is further disposed on the gate insulating layer 30. As shown in Step S106 and Step S108, the source/drain 50 are defined on the active layer 40 to form the semiconductor device 100, and a microwave annealing process is finally performed thereon.

It has to describe that in the present invention, the active layer 40 is composed of a microwave absorbing material. No additional microwave absorbing unit or heating source is required for the semiconductor device provided by the present invention. Preferably, the abovementioned microwave absorbing material may be a metal oxide, a metal nitride or a metal oxide-nitride. In addition, the substrate used in the present invention is also hot limited, which may be the glass substrate or the plastic substrate.

The method for fabricating semiconductor device provided by the present invention will be described in detail by a first embodiment and a second embodiment as follows. Firstly, in the first embodiment of the present invention, as shown in Step S100, 100 nm of molybdenum (Mo) is deposited on the washed glass substrate 10 to form the gate 20 by the DV sputter. Then, as shown in Step S102, 150 nm silicon nitride is deposited on the gate 20 to form the gate insulating layer 30 by the plasma enhanced chemical vapor deposition (PECVD) conducted at 400° C.

Moreover, as shown in Step S104, 50 nm amorphous indium gallium zinc oxide (a-IGZO) is deposited on the gate insulating layer 30 to form the active layer 40 by the DV sputter. The composition of indium gallium zinc oxide is 1:1:1:4 (In:Ga:Zn:O). The power of sputtering system is 100 W, and the flow rate of argon is 100 sccm at room temperature. This is just a preferred the present invention, but the present invention does not limit to it.

As shown in Step S106, 100 nm indium tin oxide (ITO) is deposited on the active layer 40 by the RF sputter and etched by photomask process to form the source/drain, in order to achieve the semiconductor device 100 shown in FIG. 2. Finally, as shown in Step S108, the semiconductor device 100 is treated by a microwave annealing process as follows:

Annealing treatment time: 0 second~600 second
Microwave power: Less than 1500 W
Microwave frequency: 2 GHz~18 GHz According to the process condition of Step S108, the semiconductor device can be roughly divided into four groups: 1P__100 s (600 W of microwave power and 100 seconds of annealing treatment time), 1P__300 s (600 W of microwave power and 300 seconds of annealing treatment time), 1P__600 s (600 W of microwave power and 600 seconds of annealing treatment time) and 2P__100 s (1200 W of microwave power and 100 seconds of annealing treatment time) for further evaluation of device characteristics.

It has to note that though the indium gallium zinc oxide (i.e. metal oxide) is used for the active layer 40 in the first embodiment, the metal nitride or the metal oxide-nitride can also be used in the present invention. Thus, in the second embodiment of the present invention, as shown in Step S100, 100 nm tungsten molybdenum (MoW) is deposited on the substrate 10 to form the gate 20 by the DV sputter. Then, as shown in Step S102, 300 nm silicon dioxide is deposited on the gate 20 to form the gate insulating layer 30 by the plasma enhanced chemical vapor deposition (PECVD).

Figure 3A:
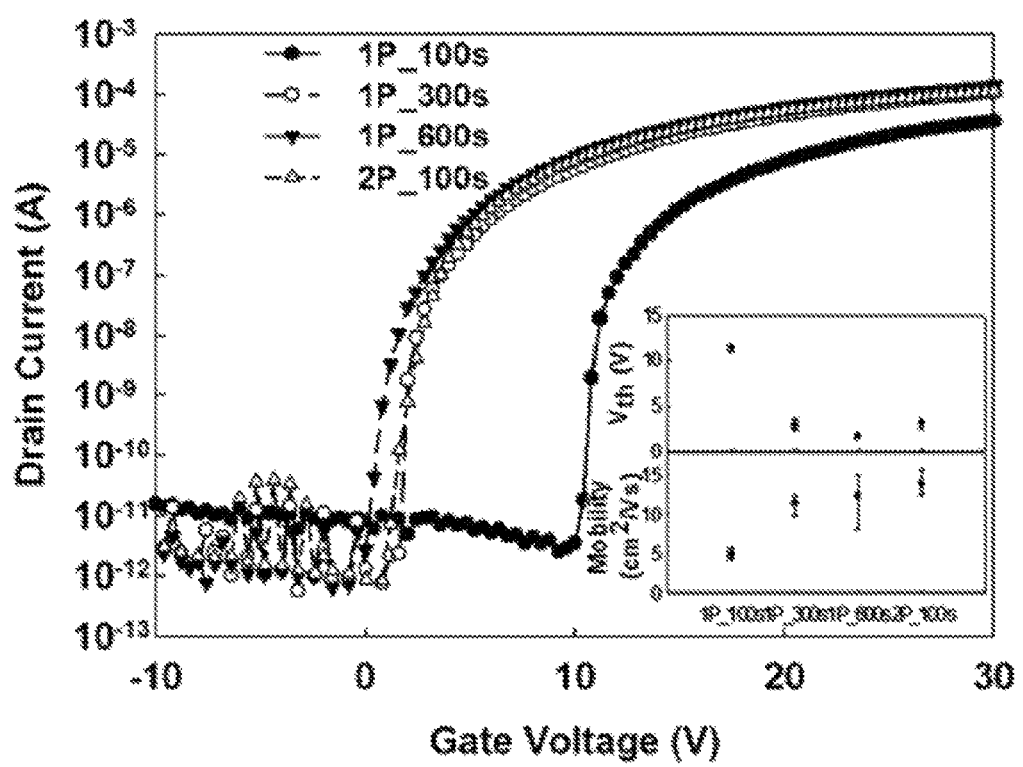
FIG. 3A illustrates the relation between the drain current and the gate voltage of the semiconductor device fabricated at different microwave annealing condition.
Figure 3B:
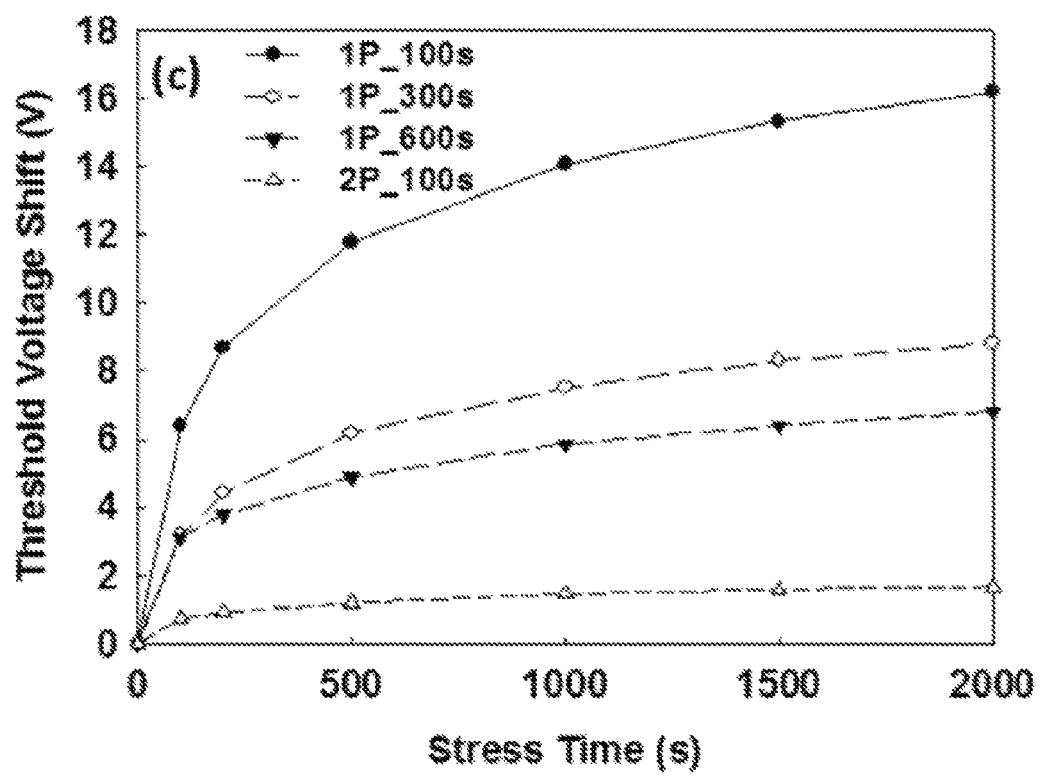
FIG. 3B illustrates the relation between the critical voltage drift and the stress time of the semiconductor device fabricated at different microwave annealing condition.
Figure 3C:
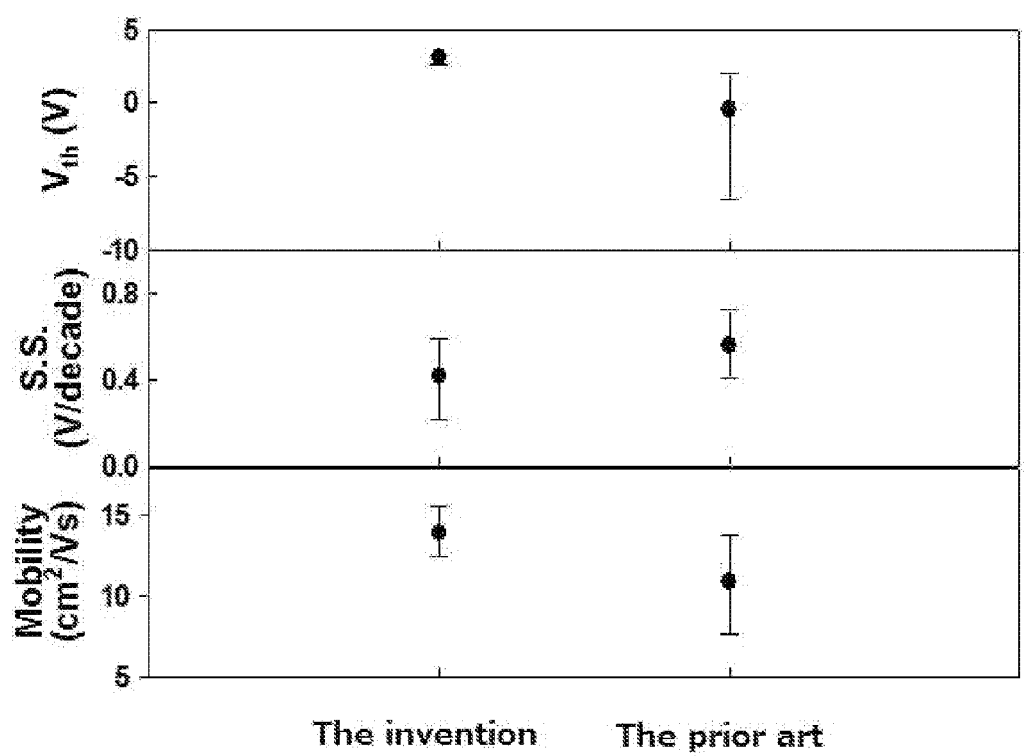
FIG. 3C illustrates the comparison diagram for the electric performance between the semiconductor device provided by the first embodiment of the present invention and the prior device.
Figure 3D:
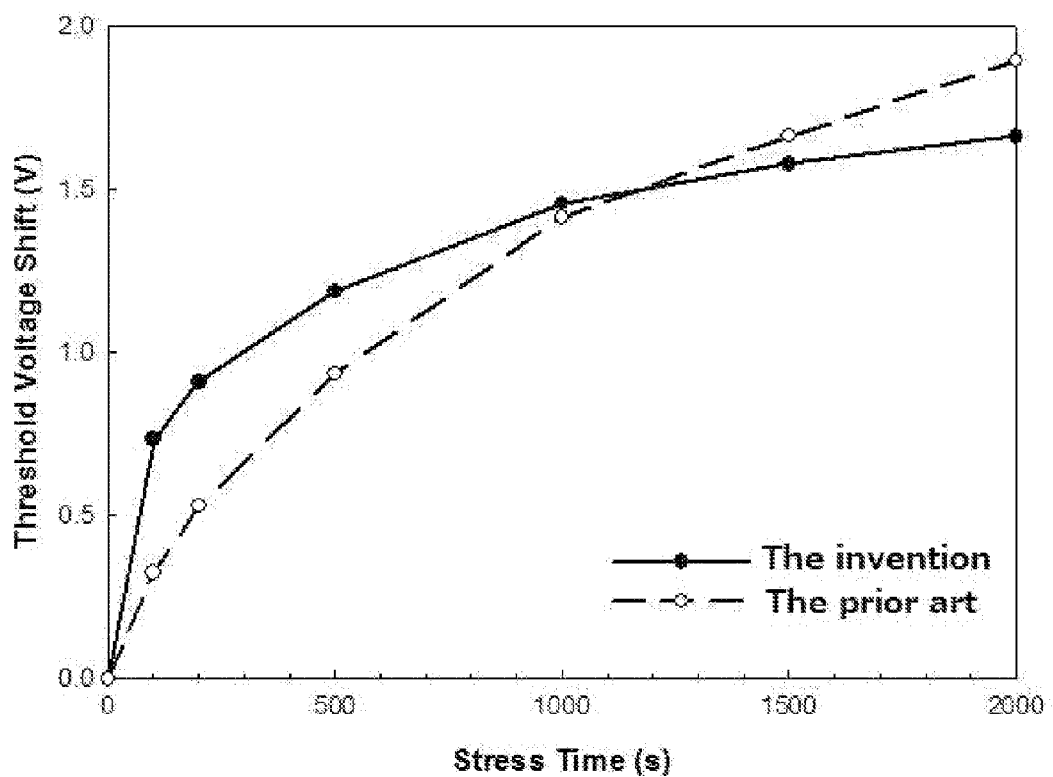
FIG. 3D illustrates the comparison diagram for the electric reliability between the semiconductor device provided by the first embodiment of the present invention and the prior device.
Figure 3E:
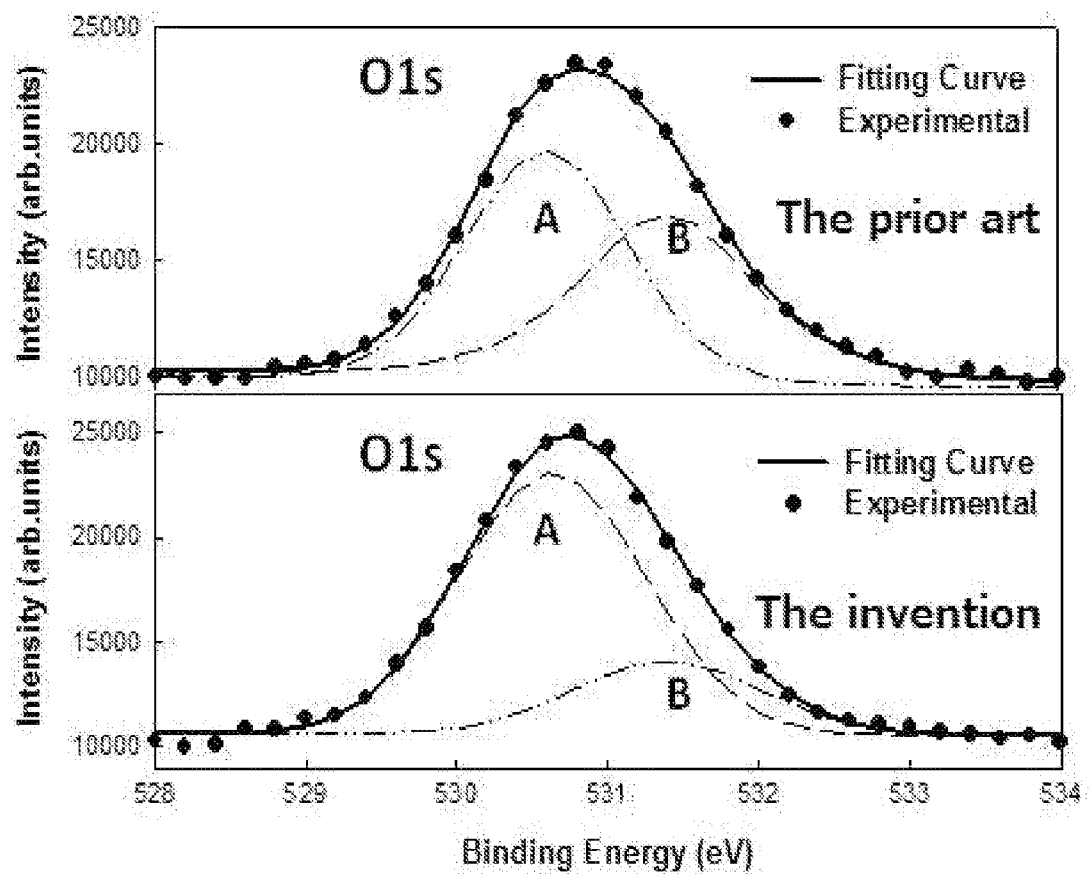
FIG. 3E illustrates the comparison diagram for the oxygen bonding energy between the semiconductor device provided by the first embodiment of the present invention and the prior device.

Then, as shown in Step S104, 50 nm amorphous nitrogen doped indium gallium zinc oxide (a-IGZO:N) is deposited on the gate insulating layer 30 to form the active layer 40 by the DV sputter. As shown in Step S106, 100 nm indium tin oxide (ITO) is deposited on the active layer 40 by the RF sputter and etched by photomask process to form the source/drain, in order to achieve the semiconductor device 100 shown in FIG. 2. Finally, as shown in Step S108, the semiconductor device 100 is treated by a microwave annealing process as follows:

Annealing treatment time: 300 seconds
Microwave power: 600 W
Microwave frequency: 5.8 GHz Please refer to FIG. 3A, FIG. 3B, FIG. 3C, FIG. 3D and FIG. 3E for the characteristics of the semiconductor device fabricated by the method according to the first embodiment of the present invention. FIG. 3A illustrates the relation between the drain current and the gate voltage of the semiconductor device fabricated at different microwave annealing condition. FIG. 3B illustrates the relation between the critical voltage drift and the stress time of the semiconductor device fabricated at different microwave annealing condition. FIG. 3C illustrates the comparison diagram for the electric performance between the semiconductor device provided by the first embodiment of the present invention and the prior device. FIG. 3D illustrates the comparison diagram for the electric reliability between the semiconductor device provided by the first embodiment of the present invention and the prior device. FIG. 3E illustrates the comparison diagram for the oxygen bonding energy between the semiconductor device provided by the first embodiment of the present invention and the prior device. In addition, the abovementioned prior device is annealed by high-temperature furnace tube (450° C.) for an hour.

As shown in FIG. 3A, FIG. 3A illustrates the transfer characteristic curve, the electron mobility, and the critical voltage for the semiconductor device with the active layer of amorphous indium gallium zinc oxide (a-IGZO) at 11V of drain/ source voltage ($V_{DS}$) under different microwave annealing condition (such as 1P__100 seconds, 1P__300 seconds, 1P__600 s, and 2P__100 s). As shown in Figure, when the microwave power is fixed at 100 W and the annealing treatment time is increased from 100 seconds to 600 seconds, the critical voltage of semiconductor device is decreased from 11.4V to 1.62V, but the electron mobility is increased. It is known that the increase of annealing treatment time will increase the electric performance of semiconductor device. Furthermore, when the microwave power is increased from 600 W to 1200 W and the annealing treatment time is maintained at 100 seconds, the critical voltage of semiconductor device is decreased from 11.4V to 3.13V, and the electron mobility is increased from 4.86 $cm^2/Vs$ to 13.9 $cm^2/Vs$. It means the electric performance of semiconductor device can be increased through the abovementioned microwave annealing treatment.

When 2.5 MV/cm of electric field is applied to the gate and the source/drain are grounded, the influence of gate stress on the semiconductor device at different microwave annealing treatment condition is shown in FIG. 3B. The critical voltage of semiconductor device after annealing treatment is decreased from 16.2V of 1P__100 s to 1.6V of 2P__100 s. It is known that after the abovementioned microwave annealing treatment, the electric reliability semiconductor device will also be increased. Similarly, the increase of microwave power and treatment time will also increase the microwave absorbing property of semiconductor device.

Please refer to FIG. 3C, FIG. 3D and FIG. 3E continuously. The abovementioned Figures illustrate the comparison diagram for the characteristics between the semiconductor device provided by the first embodiment of the present invention (treated by microwave annealing process as 2P__100 s) and the prior device (treated by high-temperature furnace tube annealing process). Firstly, as shown in FIG. 3C, as for the semiconductor device with the microwave annealing treatment, the electron mobility is higher than that of prior device, and the subcritical amplitude is smaller than that of prior device. The defect density ($N_t$) of semiconductor device can be obtained by substituting the subcritical amplitude into the following equation:

$$S.S.=\log_e 10 \times k_B T/e[1+e(tN_t+D_{it})/C_i],$$

wherein $K_B$ is the Boltzmann constant, T is the temperature, $D_{it}$ is the interface defect density, t is the thickness of active layer, and e is the charge. In addition, if tNt is the main item, then $D_{it}$ can be neglected. At this time, the defect density of semiconductor device provided by the present invention and the prior device is $2.49 \times 10^{17}$ and $3.51 \times 10^{17}$ cm$^{-3}$, respectively. It means that the defect density of semiconductor device provided by the first embodiment of present invention is lower than that of the prior device.

Finally, please refer to FIG. 3E. The semiconductor device treated by the microwave annealing process has higher oxygen bonding energy (see Peak A) and lower defect structure (see Peak B). Thus, the microwave energy can penetrate into the active layer of semiconductor device effectively, in order to modify and improve the defect structure in device, and increase the electric performance and reliability of semiconductor device.

Figure 4A:
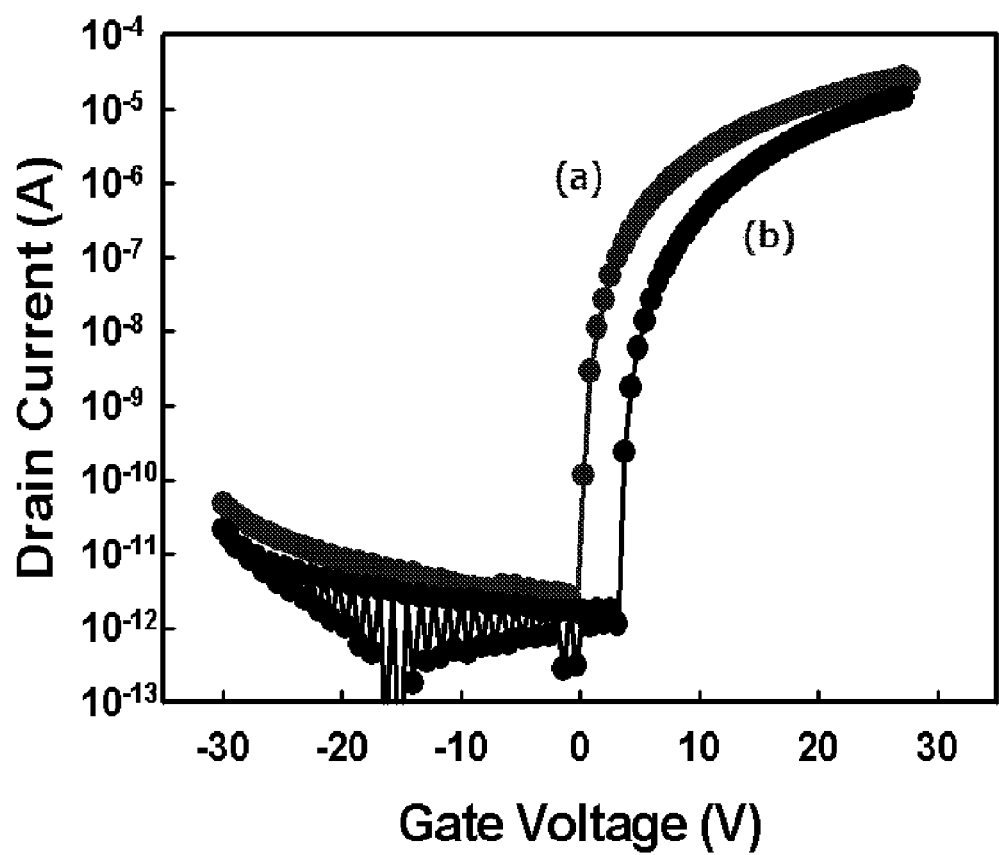
FIG. 4A illustrates the relation between the drain current and the gate voltage of the semiconductor device provided by the second embodiment of the present invention and the prior device.
Figure 4B:
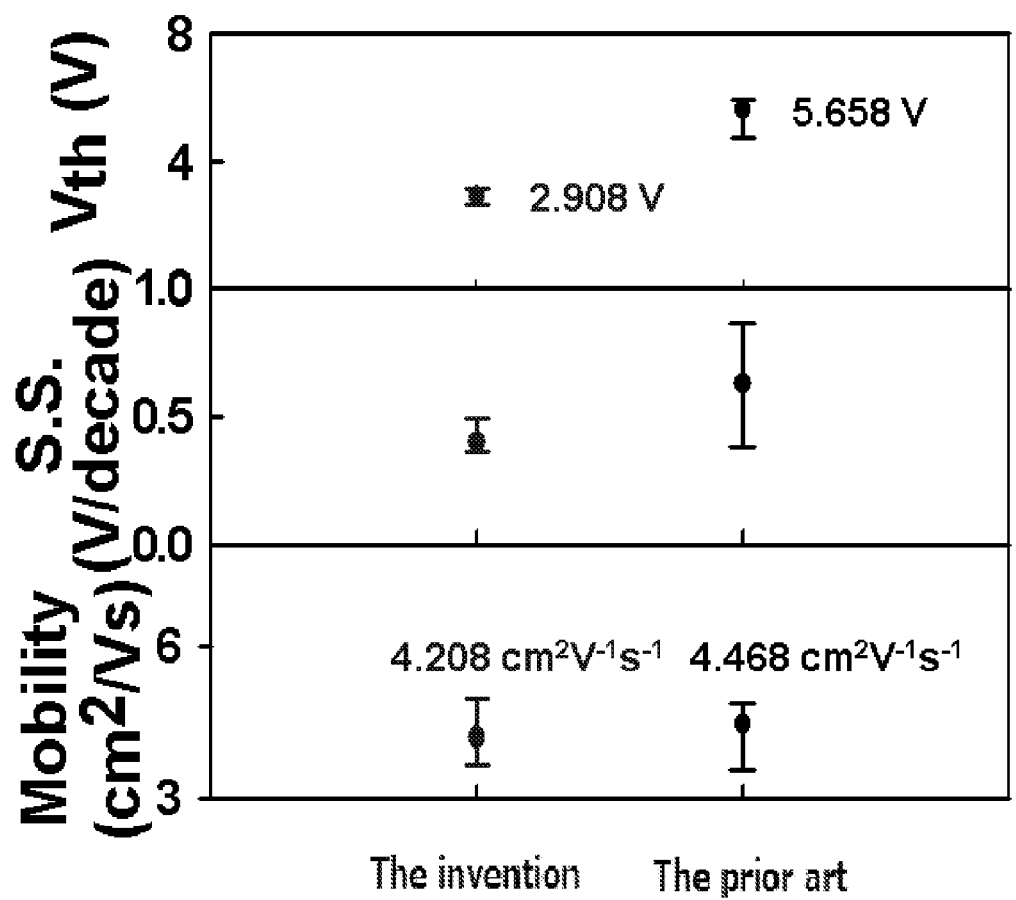
FIG. 4B illustrates the comparison diagram for the electric performance between the semiconductor device provided by the second embodiment of the present invention and the prior device.

Please refer to FIG. 4A and FIG. 4B. FIG. 4A illustrates the relation between the drain current and the gate voltage of the semiconductor device provided by the second embodiment of the present invention. FIG. 4B illustrates the comparison diagram for the electric performance between the semiconductor device provided by the second embodiment of the present invention and the conventional device. Basically, the main difference between the first embodiment and the second embodiment is different material of the active layer. In the second embodiment, the active layer is composed of the nitrogen doped indium gallium zinc oxide.

As shown in FIG. 4A and FIG. 4B, the curve (a) illustrates the semiconductor device treated by the microwave annealing process (600 W of microwave power and 300 seconds of treatment time) in the second embodiment of the present invention. The curve (b) illustrates the semiconductor device treated by the high-temperature furnace tube annealing process (350° C. and 1 hr of treatment time). The semiconductor device provided by the second embodiment of the present invention has lower critical voltage and subcritical amplitude, and has lower defect density compared to the prior device. It is known that the fabrication method provided by the present invention can also be used for the active layer composed of the microwave absorbing material, such as the metal nitride or the metal oxide-nitride.

In summary, the present invention provides a method for fabricating semiconductor device. The purpose is to use the active layer with microwave absorbing characteristic and the follow-up microwave annealing process to modify the defect structure of device, and has the following features:

1. In the abovementioned Step S108 of the method for fabricating semiconductor device provided by the present invention, the temperature of semiconductor device is not greater than 600° C., thus the whole process is a low heat budget process, which is able to reduce the consumption of heat;

2. Reduce the process time, and increase the production rate;

3. It can focus on heating specific material or specific film layer (i.e. the abovementioned active layer), in order to reduce the influence of high temperature on other material layer;

4. High even heat; and

5. Compared to the prior device treated by furnace tube annealing process, the semiconductor device treated by the microwave annealing process has been better including basic electrical property, electron mobility, subcritical amplitude, and long-term operating reliability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating semiconductor device by a microwave annealing process, for increasing the efficiency of semiconductor device, wherein a treatment time of the microwave annealing process is by selected from the group consisting of 100 seconds, 300 seconds, and 600 seconds, comprising:

depositing a 100 nm molybdenum (Mo) to form a gate on a washed glass substrate by a DV sputter;

depositing a 150 nm silicon nitride on the gate to form a gate insulating layer on the gate by the plasma enhanced chemical vapor deposition (PECVD) conducted at 400° C.;

depositing a 50 nm amorphous indium gallium zinc oxide (a-IGZO) on the gate insulating layer to form an active layer on the gate insulating layer by the DV sputter, wherein the composition of indium gallium zinc oxide is 1:1:1:4 (In:Ga:Zn:O);

depositing a 100 nm indium tin oxide (ITO) on the active layer by a RF sputter and etched by photomask process to define a source/drain on the active layer to form the semiconductor device; and performing a microwave annealing process, wherein, a microwave power generated in the microwave annealing process is less than 1500 W, a microwave frequency generated in the microwave annealing process is between 2 GHz and 18 GHz, a treatment time of the microwave annealing process is selected from the group consisting of 100 seconds, 300 seconds, and 600 seconds.

* * * * *